(12) United States Patent
Backram et al.

(10) Patent No.: US 6,191,650 B1
(45) Date of Patent: Feb. 20, 2001

(54) CLASS D AMPLIFIER WITH PULSE WIDTH MODULATION AND A VERY LOW POWER CONSUMPTION

(75) Inventors: Lars Backram; Hans-Erik Backram, both of Säffle; Börje Gustafsson, Svanskog, all of (SE)

(73) Assignee: G/N Netcom A/S, Ballerup (DK)

( * ) Notice: Under 35 U.S.C. 154(b), the term of this patent shall be extended for 0 days.

(21) Appl. No.: 09/319,340

(22) PCT Filed: Dec. 11, 1996

(86) PCT No.: PCT/DK96/00523

§ 371 Date: Jun. 29, 1999

§ 102(e) Date: Jun. 29, 1999

(87) PCT Pub. No.: WO98/26501

PCT Pub. Date: Jun. 18, 1998

(51) Int. Cl.[7] .................................................. H03F 3/38
(52) U.S. Cl. .................................... 330/10; 330/207 A
(58) Field of Search ................................ 330/10, 207 A, 330/291; 332/109; 375/238

(56) References Cited

U.S. PATENT DOCUMENTS

| 4,689,819 | 8/1987 | Killion | 381/68 |
|---|---|---|---|
| 5,014,016 | 5/1991 | Anderson | 330/10 |
| 5,115,205 | 5/1992 | Holmes, Jr. | 330/10 |
| 5,352,986 | 10/1994 | Modgil et al. | 330/10 |
| 5,805,020 | * 9/1998 | Danz et al. | 330/10 |
| 6,014,055 | * 1/2000 | Chester | 330/10 |

FOREIGN PATENT DOCUMENTS 57-97710   6/1982   (JP) .

* cited by examiner

*Primary Examiner*—Steven J. Mottola
(74) *Attorney, Agent, or Firm*—Altera Law Group, LLC

(57) ABSTRACT

The invention concerns a class D amplifier in which a high-frequency reference signal is pulse width modulated by an input signal, such as an audio signal, and in which there are generated a pair of bipolar pulse drive signals, comprising an error generator which forms a signal with an average value which corresponds to the DC component of the pulse drive signals, and which is fed back to the pulse width modulator for the adjustment of the modulator. The high-frequency reference signal is generated from a first clock signal, and the individual pulses of the respective pulse drive signals are controlled via a second clock signal which is derived from the first clock signal.

5 Claims, 2 Drawing Sheets

CLASS D AMPLIFIER WITH PULSE WIDTH MODULATION AND A VERY LOW POWER CONSUMPTION

The invention concerns a class D amplifier as disclosed in the preamble to claim 1.

Where a wide range of portable products within telecommunication, video and audiometrics are concerned, as well as hearing aids and other micro-electronics, the weight and the physical dimensions of the equipment play an important role for the equipment's field of application and marketability.

The power consumption belongs typically among the important factors which are determinative for precisely the weight and the physical dimensions of the portable equipment. Therefore, in many connections it is decisive that attempts are made to reduce the power consumption as much as possible.

The function of a class D amplifier involves pulse width modulation of a constant, high-frequency signal by a proper signal, e.g. an audio signal. The modulated signal is dissipated across a load, such as a loudspeaker, and since the high-frequency signal is of a considerably higher frequency than the transfer range of the low-pass filter which constitutes the load, the high-frequency modulation components are filtered out.

Class D amplifiers are characterized by being built up of a small number of components and by consuming very little current in comparison with, for example, class AB amplifiers.

However, a typical problem with known class D amplifiers is that a relatively high DC idling current flows through the load when there is no signal.

In patent publication no. U.S. Pat. No. 5,352,986 there is disclosed a class D amplifier where the idling current is minimized by feeding back a signal which is derived from the average respective pulse times of two high-frequency pulses of opposite polarity which are pulse width modulated and used to drive the power stage for a coupled load. Compensation is hereby made for the offset errors which can arise in connection with the analog components in the pulse width modulator, and which lead to undesired no-signal DC current through the load.

This document forms the basis of the introductory part of claim 1.

However, the circuit according to U.S. Pat. No. 5,352,986 is not considered to be able to provide a sufficiently precise compensation for DC currents through the load.

It is a primary object of the above-mentioned invention to further reduce the DC error in a class D amplifier with DC feedback.

It is a further object of the invention to minimize as much as possible the use of analog circuit elements and hereby reduce the cost of the production of the coupling, e.g. by the implementation of ASIC design in a large part of the circuit, and to a wide extent to reduce or completely avoid adjustment and calibration of the coupling.

These objects are achieved with the invention as defined in claim 1.

The class D amplifier achieved herewith is one with particularly high efficiency and low production costs.

With the present coupling, there is achieved a DC error current which is typically less than 0.1% of the peak level.

The coupling requires no adjustment and is extremely temperature stable.

Moreover, the coupling displays a very low degree of cross-over distortion, which is normally most appreciable at low signal levels.

For the known class D amplifiers, operation is typically effected with a certain time overlap in order to reduce the cross-over distortion. If the input signal is under a certain limit, there are still generated signals which are short and which are at both outputs simultaneously. Otherwise there would be a dead band where a signal change from no-signal to a certain lower signal level will cause a stepped change in the output signal. The present coupling makes it possible to reduce the time overlap by many powers of 10, so that the no-signal current consumption is correspondingly reduced.

Furthermore, there is also achieved a certain saving in current in that the complexity of the error adjustment circuit is greatly reduced.

DESCRIPTION OF A PREFERRED EMBODIMENT OF THE INVENTION

Figure 1:
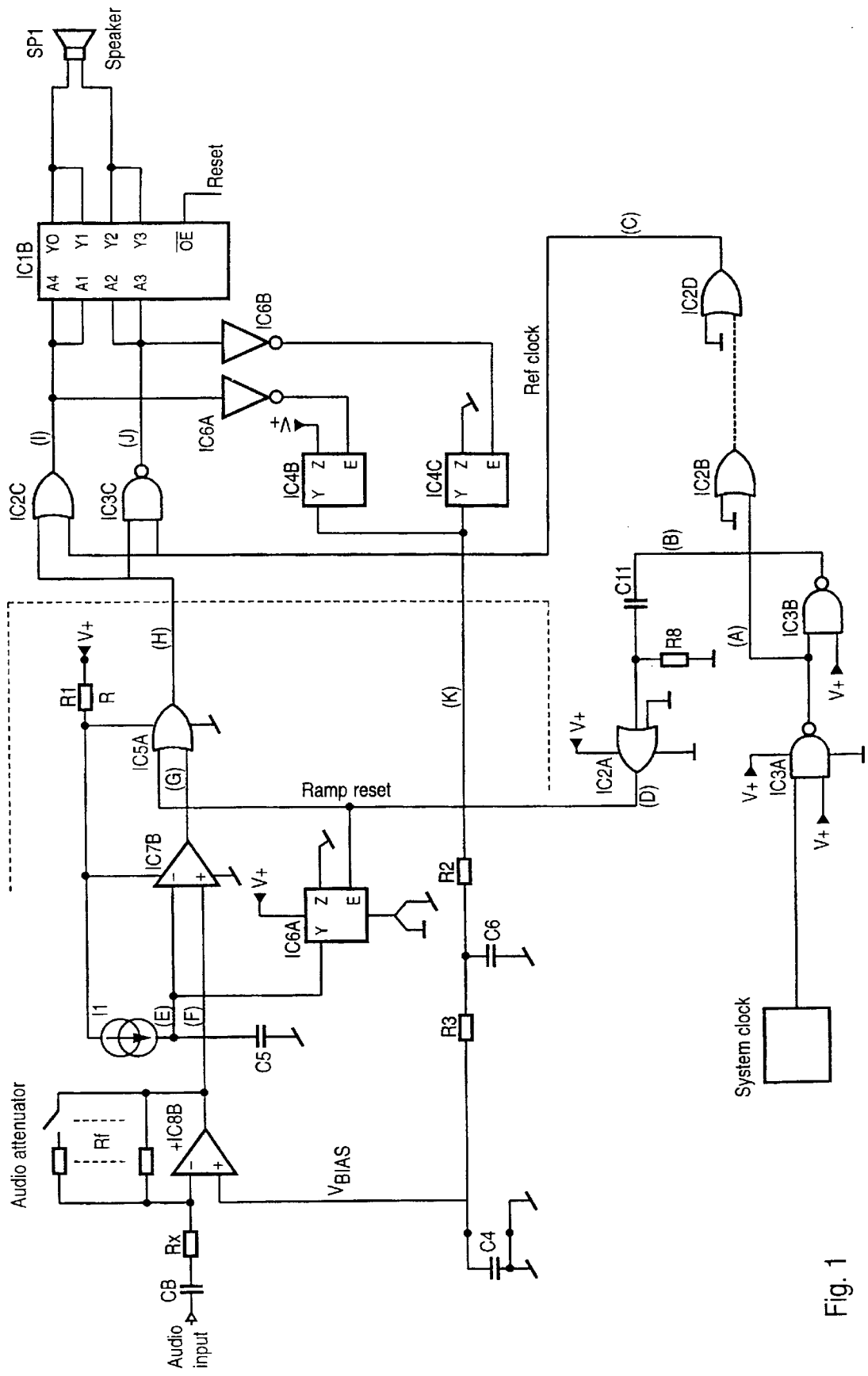
FIG. 1 shows a class D amplifier according to the invention.

An input signal, in this case an audio signal, passes the capacitor C8 and is fed to a preamplifier which contains the operational amplifier IC8B, the gain of which is regulated by the adjustable resistance network $R_f$, and the offset level of which can be set by means of the voltage $V_{bias}$ which is applied to the positive input of the operational amplifier. The analog signal F amplified in the operational amplifier IC8B is fed to a conventional pulse width modulator which is mainly made up of the following circuit elements: constant current generator Il/capacitor C5, which forms a ramp generator, the comparator IC7B and the OR circuit IC5A.

A system clock circuit is built up in the normal manner around a quartz crystal for the generation of a clock frequency which is relatively high in relation to the input signal, for example 32 kHz. This circuit generates a system clock signal A which is inverted in a buffer link, NAND circuit IC3A.

The system clock signal A is converted by the circuit elements IC3B, the ramp reset timing circuit R8/C11/OR circuit IC2A to the ramp reset signal D, whereby the link R8/C11 determines the duration of the ramp reset pulse D. The ramp reset signal D sets the ramp generator Il/CS to zero across the electric switch IC6A, so that a saw-toothshaped reference signal E of relatively high frequency is generated. This saw-tooth reference signal E is compared with the acoustically-derived signal F in the comparator IC7B, the output signal of which forms the pulse modulated output signal G. The pulse width modulated signal H is generated from the signal G by the OR circuit IC5A, the duty cycle of which corresponds to the amplitude of the analog input signal for a given time.

A difference generator consisting of the OR circuit IC2C and the NAND circuit IC3C converts the pulse width modulated pulse train H to two bipolar pulse trains I and J. These pulsed drive signals must now be directly amplified and applied to a load such as a loudspeaker.

A signal, reference clock or ref clock C, is similarly derived from the system clock signal A and is delayed in relation to this through a buffer link, IC2B and IC2D, in such a way that ref clock C is timewise offset from, but otherwise occurs synchronously with, the ramp reset signal D.

The ref clock signal C, by means of OR circuit IC2C, controls that the rear flank of the individual pulses in the pulse train I are practically almost coincident with a positive change $C_O$ in the ref clock signal C. Similarly, by means of NAND circuit IC3C, the ref clock signal C controls that the leading edge of the individual pulses in the pulse train J are practically almost coincident with a positive change $C_O$ in the ref clock signal C.

A power stage IC1B amplifies the signals I and J and is coupled directly to the terminals for a load which, in this example, is a loudspeaker. This power stage is provided with slew-rate-limiting outputs to reduce high-frequency radiation from the power stage.

The respective pulse drive signals I and J, across respective inverters IC6A and IC6B, each drive an electric switch, the outputs of which are joined in the connection K. The signal I drives the switch IC4B, which generates pulses with a positive reference voltage, while the signal J drives the switch IC4C which generates pulses with the voltage 0. Information concerning DC errors can be derived directly from the signals I and J when no signal is applied to the input of the amplifier, since the pulse length of one of the signals I or J will directly express a phase error which represents the DC error, and which depending on tolerances for the analog components easily arises, among other things due to offset errors and delays in the pulse width modulation circuit.

The signal K is integrated across the link R3/C4, which thus forms an average value of the respective pulse trains I and J and herewith represents the DC error which has arisen in the pulse width modulator. The signal, which is also filtered for high-frequency composants by R2/C6, e.g. "glitches", is fed back to the positive input of the comparator IC8B, whereby offset is regulated to compensate for the DC error which has arisen.

The signal sequences according to the invention will now be described in more detail with reference to FIG. 2.

Figure 2:
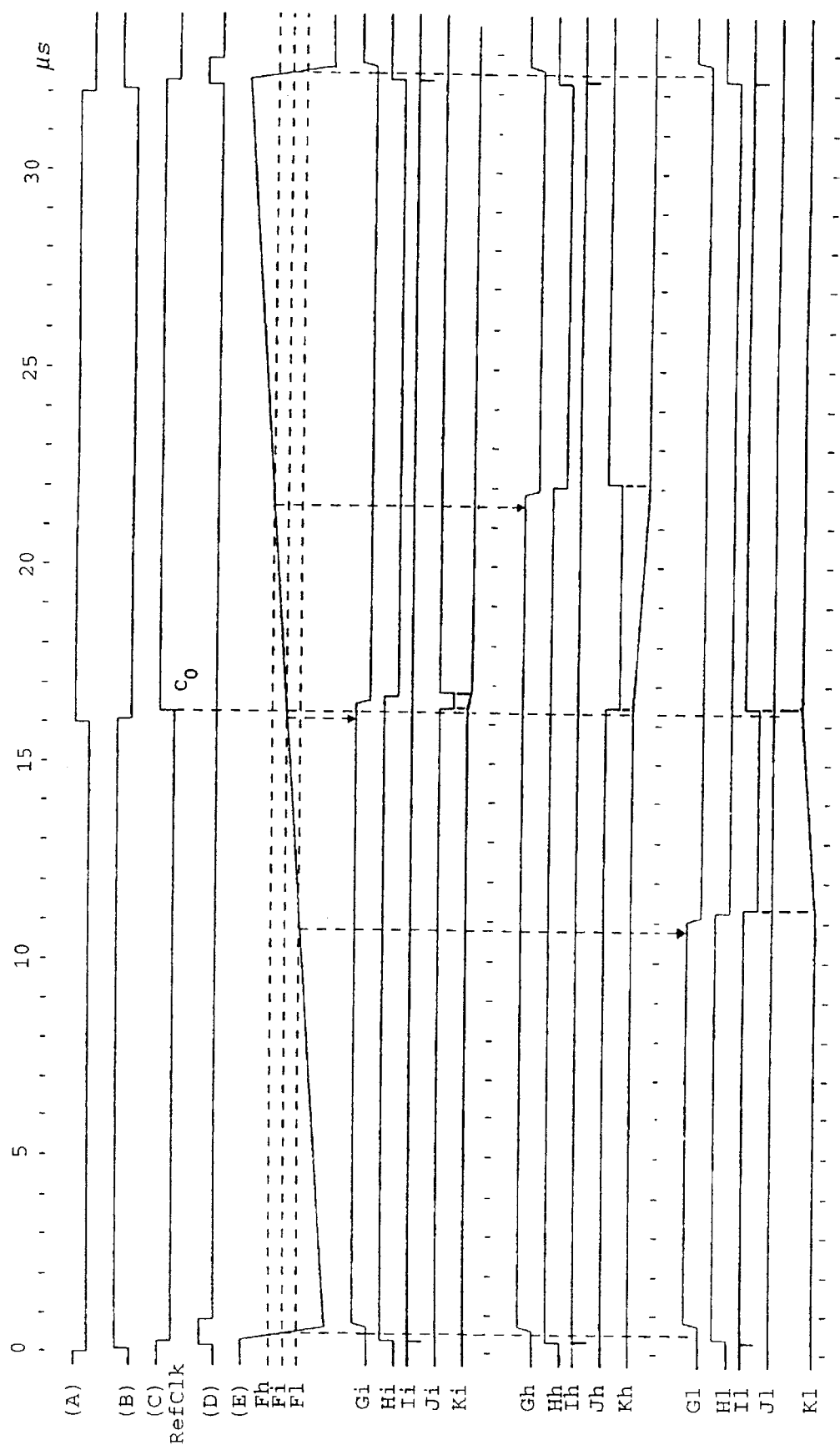
FIG. 2 shows the signal sequences for the class D amplifier according to the invention.

It will be seen from FIG. 2 that the signals A, B and C, all of which are derived from the system clock, are offset in relation to one another. This is done in order to counteract the negative effect of "glitches" from the sawtooth generator. It is seen that the ref clock signal C is delayed slightly in relation to the ramp reset pulse D and, since this pulse D defines the saw-tooth pulse E, a period of the reference clock signal C is of precisely the same duration as, but slightly offset from, a period of the sawtooth pulse E.

The signals are shown corresponding to a period of the signal A of around 32 µs, which corresponds to a system clock signal of 32 kHz.

It is seen by the rising flank $C_O$ that ref clock C lies at the midpoint between the edges of a saw-tooth pulse. This point represents a reference point on each saw-tooth pulse. The point does not necessarily constitute the precise geometric midpoint between the edges of the saw-tooth pulse, but defines a point which has the same position on each saw-tooth pulse.

In FIG. 2, a number of signal values for the amplified and offset-regulated, analog input signal F are shown overlying the saw-tooth pulse E. $F_h$ represents a high signal level, $F_i$ represents a signal level close to idling voltage and $F_l$ represents a low signal level.

The signal A is shown for a period corresponding to the 32 kHz system clock signal.

The signal sequences, including the formation of the signal drive pulses G, H, I and J for these three input levels are shown with the notation h, i and l below the saw-tooth pulse E in FIG. 2.

In the case of the high signal level $F_h$, the comparator IC7B will change from high to low when the saw-tooth pulse E exceeds $F_h$. This change defines the trailing edge of the bipolar pulse drive signal $I_h$. The leading edge of the pulse drive signal $I_h$ is defined by the rising edge $C_O$ of ref clock C.

In the case of the low signal level $F_l$, it applies analogically that the comparator IC7B changes from high to low when the saw-tooth pulse E exceeds $F_l$. This change defines the leading flank of the bipolar pulse drive signal $I_l$. The rear flank of the pulse drive signal $I_h$ is defined by the rising flank $C_O$ of ref clock C.

As explained above, the signal K represents a so-called phase error signal and is integrated for the voltage $V_{bias}$ which is fed back to the comparator as an offset voltage to compensate for DC errors.

In the case of the idling signal $F_i$, it is seen that the comparator IC8B gives rise to a change in $H_i$ from high to low with a certain delay in relation to the clock signal ref clock C. This means that $J_i$ goes down briefly, and that a pulse train is herewith transmitted from this output, while the other output I is constant. This error signal will give rise to a DC error current through the load.

These brief error pulses will, however, be integrated across the integrator link R3/C4, the result being that the voltage across C4, $V_{bias}$, will regulate the offset of the AC input signal via comparator IC8B, so that the above-mentioned error pulses will be adjusted down to a negligible value.

It follows immediately from the above example that the magnitude of the $V_{bias}$ correction signal will depend on the length of the pulse $J_i$ or, in other words, the length of time for which the pulse $J_i$ is delayed in relation to the reference point defined by the positive edge $C_O$ of the ref clock C signal.

It is not only constant idling signals in the vicinity of the reference midpoint of the saw-tooth signal at amplitude values corresponding to $C_O$ of ref clock that will cause $V_{bias}$ to be regulated. When an AC signal is applied to the input, a resulting DC error current will cause $V_{bias}$ to be regulated corresponding to the DC error, since the AC contributions are of opposite polarity and of equal magnitude.

What is claimed is:

1. A class D amplifier for the amplification of an input signal, e.g. an audio signal, comprising a pulse width modulator in which a high-frequency reference signal (E) is pulse width modulated by the input signal, a difference generator in which there is generated a pair of bipolar pulse drive signals (I, J) with duty cycles corresponding to the magnitude of the input signal for a given time, and an error generator which by the two pulse drive signals forms a signal corresponding to the average DC component of the pulse drive signals, and which is fed back to the pulse width modulator for the adjustment of the modulator, so that the amplified AC signal's average DC part moves towards zero, characterized in that the high-frequency reference signal is generated from a first clock signal (A), and in that either the leading edge or the trailing edge of the individual pulses in the respective pulse drive signals (I, J) are controlled to occur synchronously with a second clock signal (C) derived from the first clock signal (A).

2. A class D amplifier according to claim 1, characterized in that the pulse width generator comprises a saw-tooth generator (I1, C5, IC6A) which generates a saw-tooth-shaped, high-frequency reference signal (E), and a comparator (IC7B) in which an offset-regulated and amplified signal (F) of the input signal is compared with the saw-tooth signal (E), whereby the first clock signal (A) defines the saw-tooth pulse (E), including the duration of said saw-tooth pulse (E), and a reference time ($C_O$) defined by the second clock signal (C) lying between two declining edges for a saw-tooth tooth pulse (E), and in that the individual pulses in each respective pulse train of the pulse drive signals (I, J) have a edge which is practically almost coincident with the above-mentioned reference time ($C_O$), whereby the duration of the individual drive pulses is defined in relation to this time ($C_O$), so that the DC error of the pulse drive signals (I, J) gives rise to the adjustment of the offset for the signal (F) amplified from the input signal by comparison with the sawtooth reference signal (E) in relation to the delay of this time ($C_O$).

3. A class D amplifier according to claim 2, characterized in that a third clock signal (D), which is derived from the first clock signal (A) and which directly generates the saw-tooth signal (E), is slightly offset in relation to the reference clock signal (C), so that "glitches" which may arise in the generation of the saw-tooth signal (E) do not have any influence on the formation of the pulse drive signals (I, J) controlled by the second clock signal (C).

4. A class D amplifier according to claim 2 characterized in that an output signal (G) from the comparator (IC7B), where the derived input signal is compared with the saw-tooth signal (E), is fed further to a first digital, basic, logic operator (IC5A) which forms a signal (H), and in that the pulse drive signals (I, J) are formed from here via a second and third basic, logic operator (IC2C, IC3C), which function as buffers and which are triggered by the second clock signal (C), from the output signal (H) of the first basic, logic operator (IC5A), in such a manner that the individual pulses in the pulse drive signals (I, J) are never active at the same time, but are adjacent to each other for a time which is practically almost coincident with $C_O$.

5. A class D amplifier according to claim 1 characterized in that the first clock signal (A) is generated by a clock generator built up around a quartz crystal.

\* \* \* \* \*